United States Patent [19]

Milkovic

[11] 4,255,704
[45] Mar. 10, 1981

[54] ZERO CROSSING DETECTION AND ELECTRONIC COMPENSATION OF D. C. SATURATION MAGNETIZATION IN CURRENT TRANSFORMERS USED IN WATTHOUR METER INSTALLATIONS

[75] Inventor: Miran Milkovic, Scotia, N.Y.

[73] Assignee: General Electric Company, Somersworth, N.H.

[21] Appl. No.: 80,553

[22] Filed: Oct. 1, 1979

[51] Int. Cl.³ .......................... G01R 1/20; G05F 1/24
[52] U.S. Cl. .................................. 324/127; 323/357; 324/110
[58] Field of Search ................... 324/127, 110, 117 R; 323/6, 44 R, 48; 179/170 R

[56] References Cited

U.S. PATENT DOCUMENTS

| | | | |
|---|---|---|---|
| 3,665,125 | 5/1972 | Valbonesi | 179/170 R |
| 4,096,363 | 6/1978 | Earp | 323/6 |

Primary Examiner—Ernest F. Karlsen
Attorney, Agent, or Firm—Robert E. Brunson

[57] ABSTRACT

A watthour meter installation of the type including an input current transformer having an input winding for connection to an AC power supply line, an output winding for connection to a watthour meter for measuring AC power being consumed and a core on which the input and output windings are wound and which is susceptible to DC magnetization by a DC component superimposed on the AC being measured. In order to overcome the effect of the DC component on the magnetization characteristics of the input transformer, automatic compensation circuitry is provided which includes a sensor coupled to sense the current flowing through the input winding and for deriving a sensed output signal proportional to the sensed current which includes both AC and DC components of the input current. A sensed signal processing circuit is provided in the form of a zero crossing detection circuit together with an amplitude referencing circuit and averaging circuit for deriving from the sensed voltage signal a feedback signal which is proportional only to the superimposed DC component flowing in the input winding. This feedback signal is converted to a current feedback signal and supplied back through a compensating winding wound on the input transformer core in a direction to automatically cancel out the effects of the superimposed DC component on the saturation characteristics of the core of the input current transformer.

7 Claims, 5 Drawing Figures

$V_Y$ WITHOUT COMPENSATION $V_Y$ WITH COMPENSATION

ZERO CROSSING DETECTION AND ELECTRONIC COMPENSATION OF D. C. SATURATION MAGNETIZATION IN CURRENT TRANSFORMERS USED IN WATTHOUR METER INSTALLATIONS

BACKGROUND OF INVENTION

1. Field of Invention

This invention relates to a new and improved method and compensation circuitry for sensing the value of a direct current (DC) component superimposed on an alternating current (AC) being measured by a watthour meter installation and for deriving and feeding back a feedback signal for nulling out the effect of the DC component on the supply AC being measured.

More particularly, the invention relates to a relatively simple and low cost method of zero crossing detection and electronic compensation and circuitry for achieving compensation of a DC component superimposed on a supply alternating current being measured in a watthour meter installation.

2. Background Problem

It has become a practice of certain consumers of electricity who wish to lower their utility bills to resort to various measures which seriously affect the capability of a watthour meter installation to obtain a true measure of the electricity being consumed. For example, if a diode is placed in series with the load at a consumers dwelling or commercial installation, a direct current component is superimposed on the alternating current flowing through the load. If the particular watthour meter installation in question is designed such that it employs a current transformer for sensing the value of the supply alternating current, the direct current component superimposed on the alternating current can result in a DC magnetizing current flowing in the current transformer which tends to saturate the core of the transformer. If saturation does occur, the current transformer no longer is capable of operating over the linear portion of its magnetization characteristic and is incapable of inducing a signal in the secondary winding of the transformer which is truly proportional to the input AC. Hence, if the current transformer is part of an electronic solid state watthour meter, and its core is saturated in the above manner, the watthour meter is rendered ineffective for accurately measuring the power being consumed by the load at the installation in question.

U.S. patent application Ser. No. 33,078 filed Apr. 25, 1979 in the name of Miran Milkovic, the inventor of the present invention, for "MEANS FOR AUTOMATICALLY COMPENSATING DC MAGNETIZATION IN A TRANSFORMER" and assigned to the General Electric Company, the assignee of the present invention, describes a new and improved compensating means for counteracting direct current saturation of a current transformer in an electronic watthour meter. However, the means described in application Ser. No. 33,078 is relatively complex in that it requires the use of two current transformers and relatively expensive Hall elements.

Copending U.S. patent application Ser. No. 078,058 (GED-1098) filed Sept. 24, 1979, in the name of the present inventor Miran Milkovic and entitled "PEAK DETECTION AND ELECTRONIC COMPENSATION OF D.C. SATURATION MAGNETIZATION IN CURRENT TRANSFORMERS USED IN WATTHOUR METER INSTALLATIONS," also assigned to the General Electric Company, describes and claims a relatively low cost peak detection method and circuit employing only a single current transformer for sensing the value of a DC component superimposed on an alternating current supply being measured by a watthour meter. This system employs a peak detector circuit for deriving a current feedback signal used to null out the effect of the superimposed DC component on the AC being measured.

The present invention describes a new and improved, low cost, method and simplified zero crossing detection technique which also employs a single current transformer for sensing the value of a direct current component superimposed on an alternating current supply being measured by a watthour meter and a highly accurate zero crossing detection circuit that derives a feedback signal representative of the superimposed DC component for nulling out the effect of the DC component on the supply AC being measured.

SUMMARY OF INVENTION

In practicing the invention, the effect of a DC component superimposed on a supply alternating current being measured by watthour meter installation is nullified. This nulling effect is achieved by sensing the combined value of the supply alternating current having the DC component superimposed thereon and deriving a sensed signal output proportional to both the supply AC and the superimposed DC component. The sensed signal is converted to a sensed voltage signal and the zero crossing points of the sensed voltage signal are detected. The zero crossing points are then used to derive a constant amplitude, variable duration, positive and negative going square waveshape potential that is averaged at least over a period of the supply alternating current to derive an average output signal representative of the DC component superimposed on the supply alternating current. This average output signal is converted to a current signal and fed back in advance of the watthour meter installation in a direction so as to null out the DC component superimposed on the supply alternating current being measured by the watthour meter.

The above desirable result is achieved in a watthour meter installation of the type requiring only a single current transformer having an input winding for connection to an alternating current power supply line, an output winding for connection to a watthour meter for measuring the alternating current power being consumed and a core on which said input and output windings are wound and which is susceptible to DC magnetization saturation by a DC component superimposed on the alternating current power being measured. The invention further includes circuitry for compensating for the effect of the DC component on the power measurement achieved with the watthour meter installation and which comprises a sensor coupled to sense the current flowing through the input winding and for deriving a sensed output signal proportional to both the AC and DC components of the current flowing through the input winding. A sensed signal processing circuit is coupled to the sensor for deriving from the sensed output signal a feedback signal which is proportional only to the DC component of the current flowing through the input winding. The sensed signal processing circuit comprises a current to voltage signal conversion circuit supplied with the sensed signal for converting the sensed signal to a sensed voltage signal. A zero crossing detection circuit is supplied with the sensed voltage signal for detecting the zero crossing points of the sensed voltage signal where the signal passes through zero reference level value in either a positive going or negative going direction. The zero crossing points signal is used to derive a constant amplitude, variable duration, positive and negative going square waveshape signal that is supplied to an averaging circuit, and the averaging circuit derives an output signal which is proportional to the superimposed DC component. A voltage to current signal conversion circuit is supplied with the average output signal from the averaging circuit for converting the signal to a current feedback signal. The current feedback signal then is supplied to a compensating winding wound on the transformer core in a direction to automatically cancel out the effect of the superimposed DC component on the saturation characteristics of the input transformer.

BRIEF DESCRIPTION OF DRAWINGS

These and other objects, features and many of the attendant advantages of this invention will be appreciated more readily as the same becomes better understood by reference to the following detailed description when considered in connection with the accompanying drawings, wherein like parts in each of the several figures are identified by the same reference character, and wherein.

DETAILED DESCRIPTION OF PREFERRED EMBODIMENT

Figure 1:
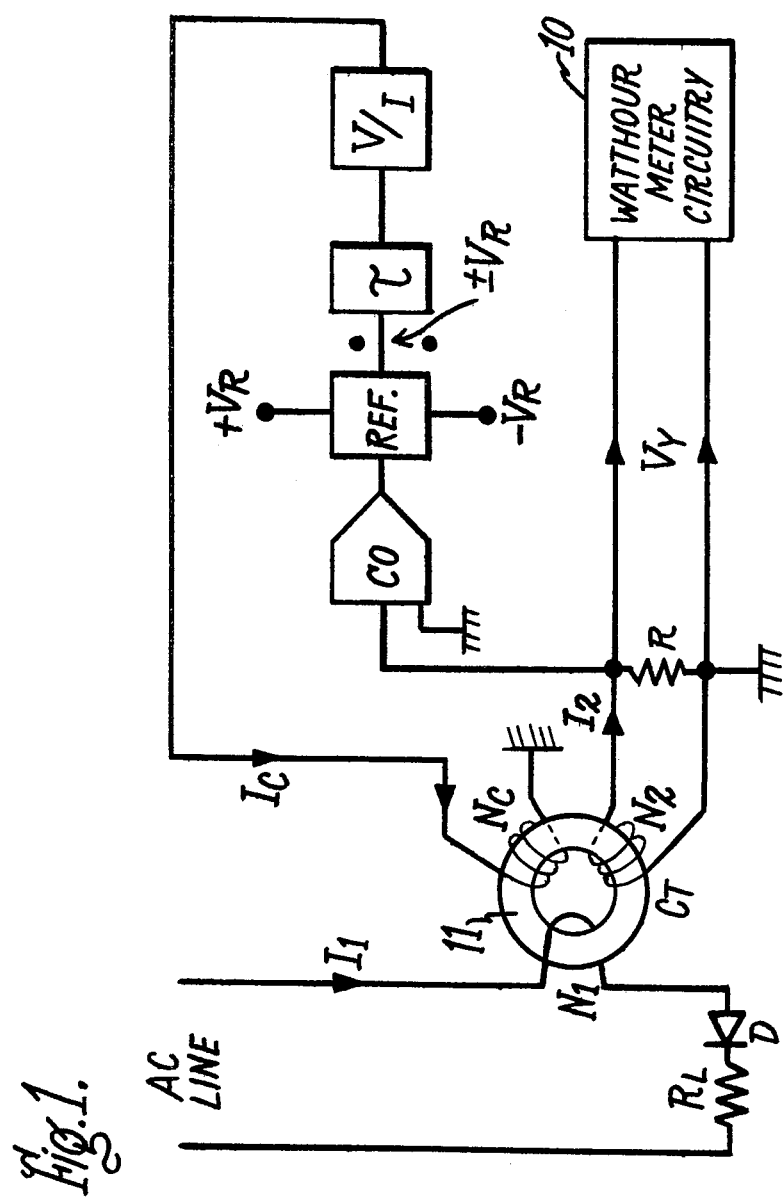
FIG. 1 is a schematic block diagram of a watthour meter electronic compensation circuit employing a zero crossing detection and averaging technique in accordance with the invention.

FIG. 1 is a functional block diagram of a novel zero crossing detection and electronic compensation circuit for practicing the method according to the invention to automatically prevent DC saturation magnetization in current transformers used in watthour meter installations. In FIG. 1 an electricity consumer's load circuit is illustrated by the resistor $R_L$ and it is assumed that the consumer has in some manner connected in series with the load circuit a diode D which could have an adverse affect on the accuracy of the reading of a watthour meter installation indicated at 10, as discussed in the preceeding paragraphs. The watthour meter installation 10 may be of the solid state electronic type as described in U.S. Pat. Nos. 3,955,138; 3,875,508; 4,066,959 or 4,066,860, for example, and has one of its inputs supplied from an input current transformer CT coupled to the alternating current supply line that supplies the consumer's load $R_L$. For convenience, the voltage input to the watthour meter circuitry 10 has not been illustrated. The input current transformer CT is comprised by a core member 11 having an input winding $N_1$ wound thereon together with an output winding $N_2$ and a compensating winding $N_C$, the purpose of which will be described more fully hereafter. With this arrangement it will be seen that load current $I_1$ supplied to the load $R_L$ must flow through the input winding $N_1$. This results in the production of magnetic lines of flux in the core CT which will thread the turns of the output winding $N_2$ and induce an output current that is supplied to the input of the watthour meter circuitry 10 as a measure of the current being consumed by the load.

Figure 3A:
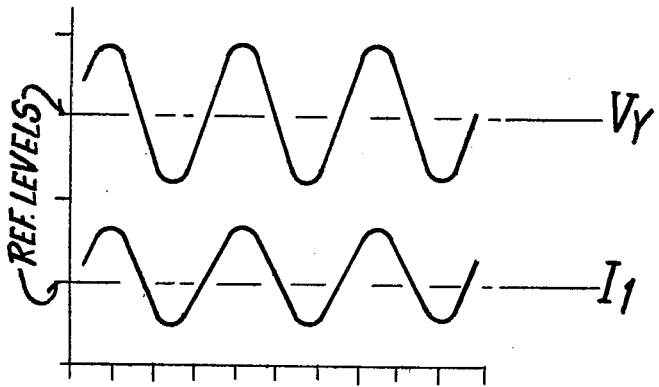
FIGS. 3a-3c are a series of waveforms illustrating operation of the embodiment of the invention shown in FIGS. 1 and 2.

Because of diode D in the input primary circuit, the current transformer CT will be magnetized by a DC flux superimposed on an AC flux. The presence of the superimposed DC flux will cause the core of the current transformer 11 to saturate at large values of primary current $I_1$. Upon this occurrence, the current transformer 11 will not operate in the linear region of its magnetization characteristic and as a result the waveshape of the output current $I_2$ supplied by output winding $N_2$ to the current input of the watthour meter circuitry 10 will be distorted. FIG. 3a of the drawings illustrates the characteristic waveform of the voltage $V_Y$ obtained across a sensor resistor R connected across the output terminals of output winding $N_2$ for an assumed input supply current $I_1$ where no diode D is connected in series with the load circuit $R_L$. Under such conditions, it will be appreciated that the output voltage waveform $V_Y$ upon which the watthour meter measurements will be predicated, is a truthful replica of the input current waveform $I_1$. Thus, without the diode D the waveform of voltage $V_Y$ appearing across sensor resistor R, is not distorted, both half waves are of equal amplitude, no DC magnetization saturation of the core of the input current transformer CT will occur, and an accurate measurement of consumed electric power can be obtained.

Figure 3B:
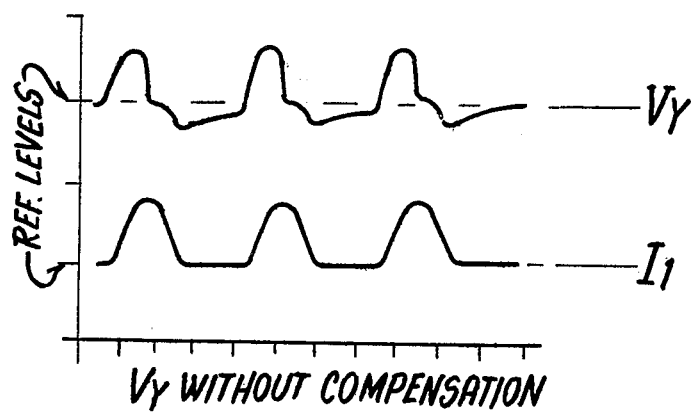

In contrast to the hypothetical conditions depicted by FIG. 3a, if the diode D is included in the primary circuit of current transformer CT as shown in FIG. 1, there will be a buildup of DC flux in the core 11 of current transformer CT, which at large input current magnitudes, eventually will saturate the core 11, and results in a distorted output current waveform similar to that shown at $V_Y$ in FIG. 3b of the drawings. This causes or could eventually cause a zero reading of a watthour meter.

In order to prevent DC saturation of the current transformer core 11 in the above-discussed manner, a compensating winding $N_C$ is added to the transformer core 11. The arrangement is such that a compensating current $I_C$ is supplied to the compensating winding $N_C$ in a direction and of a magnitude such that the flux due to the compensating winding $N_C$ compensates or nulls the flux due to the direct current flowing in the primary winding $N_1$ as a result of the superimposed DC component. For this condition to be true, it is necessary that the following relationship be maintained: $I_{DC} \cdot N_1 = I_C \cdot N_C$. From this equation it will be appreciated that in order to achieve the desired compensation, a compensating current $I_C$ must be derived corresponding to $I_C = I_{DC} \cdot N_1 / N_C$. This compensating current then must be supplied to the compensating winding $N_C$ in a direction such that the lines of flux produced by $I_C \cdot N_C$ nulls the lines of flux $I_{DC} \cdot N_1$ produced by the superimposed DC component.

In order to derive the desired compensating current $I_C$ suitable processing circuitry is provided for processing the sensed signal voltage $V_Y$ appearing across the sensing resistor R and for converting the sensed voltage to the desired feedback compensating current $I_C$ for supply to the compensating winding $N_C$. This processing circuitry is comprised by zero crossing sensing circuit means CO which is formed by a conventional, comparator circuit of the type described more fully in the textbook entitled "Applications of Operational Amplifiers," J. G. Graeme—published by McGraw Hill Book Co., New York, N.Y., pgs. 109-114. Zero crossing sensing comparator circuit CO senses the zero crossings of the voltage signal $V_Y$ in either a positive going or a negative going direction relative to a reference voltage level (which may be ground) and derives aperiodic zero crossing signal pulses of irregular occurrence and indicative of the zero crossings. The aperiodic zero crossing signal pulses are supplied to an amplitude referencing circuit means REF which converts the aperiodic zero crossing signal pulses to a series of essentially constant amplitude, varying duration, positive and negative going square waveshape signals whose duration is determined by the spacing between each zero crossing, and hence which is representative of the distortion of the waveshape of the sensed signal $V_Y$ due to the superimposed DC component. This amplitude referenced, varying duration, positive and negative going square waveshape signal then is supplied to an averaging circuit $\tau$. An average output voltage signal is obtained from averaging circuit $\tau$ which is representative of the period or duration differences between the constant amplitude, positive and negative going, varying duration square waveshape signals, and hence representative of the superimposed DC component. The average output voltage V appearing at the output of averaging circuit $\tau$ is supplied to a voltage to current signal conversion circuit V/I for converting the average output voltage to a current feedback signal $I_C$ that then is supplied to the compensating winding $N_C$ in a direction to cancel out the flux due to the superimposed DC component.

From a consideration of FIG. 3a of the drawings, where it is assumed that there is no diode D in the consumers load circuit, it will be seen that the sensed voltage $V_Y$ is a faithful waveshape replica of the supply input current $I_1$. Considering that the reference voltage level is defined as the point in the essentially sinusoidal waveform shown in FIG. 3a where the waveform passes from a positive to a negative value or from a negative to a positive value (indicated as REF LEV), it will be seen that the time duration or period occurring between each zero crossing from either a positive value voltage to a negative value or from a negative value to a positive value of both waveshapes $V_Y$ and $I_1$, all are essentially equal due to the fact that the two waveshapes are sinusoidal in character. Consequently, the resulting zero crossing pulses when referenced to a constant amplitude value which is either positive or negative, results in a square waveshape signal of constant amplitude wherein both the positive going and negative going square wave half cycles are equal in duration. Upon averaging such a signal, the average output will result in zero voltage that produces a zero current compensating feedback.

Figure 3C:
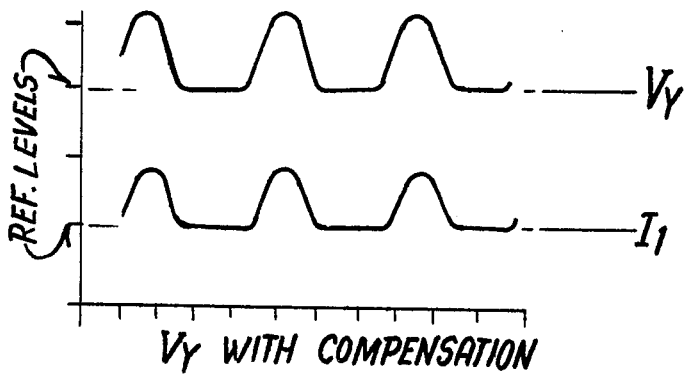

In contrast to the hypothetical condition illustrated by FIG. 3a, consider the condition depicted in FIG. 3b where due to the presence of the diode D, the core of current transformer CT has been saturated by the superimposed DC component. Under this assumed operating condition, the input supply current is half-wave rectified as shown at $I_1$ in FIG. 3b and results in an output voltage $V_Y$ waveform where the positive half peaks are of much shorter duration then the negative half peaks. As a consequence of this difference, upon the zero crossing signal pulses from CO being amplitude referenced to a constant amplitude, the resulting output aperiodic, negative and positive going square waveshape signals when averaged by averaging circuit means $\tau$ will result in a negative polarity average output voltage. This output voltage produces (upon conversion in the voltage to current converter V/I) a compensating feedback current $I_C$ flowing in the compensating winding $N_C$ which is of a direction and of an amplitude to compensate for or null out the superimposed DC component flux. This results in returning the waveform of the output current $I_C$ being measured by the watthour meter to a waveshape which corresponds substantially to the waveshape of the input current $I_1$ as shown in FIG. 3c of the drawings.

Figure 2:
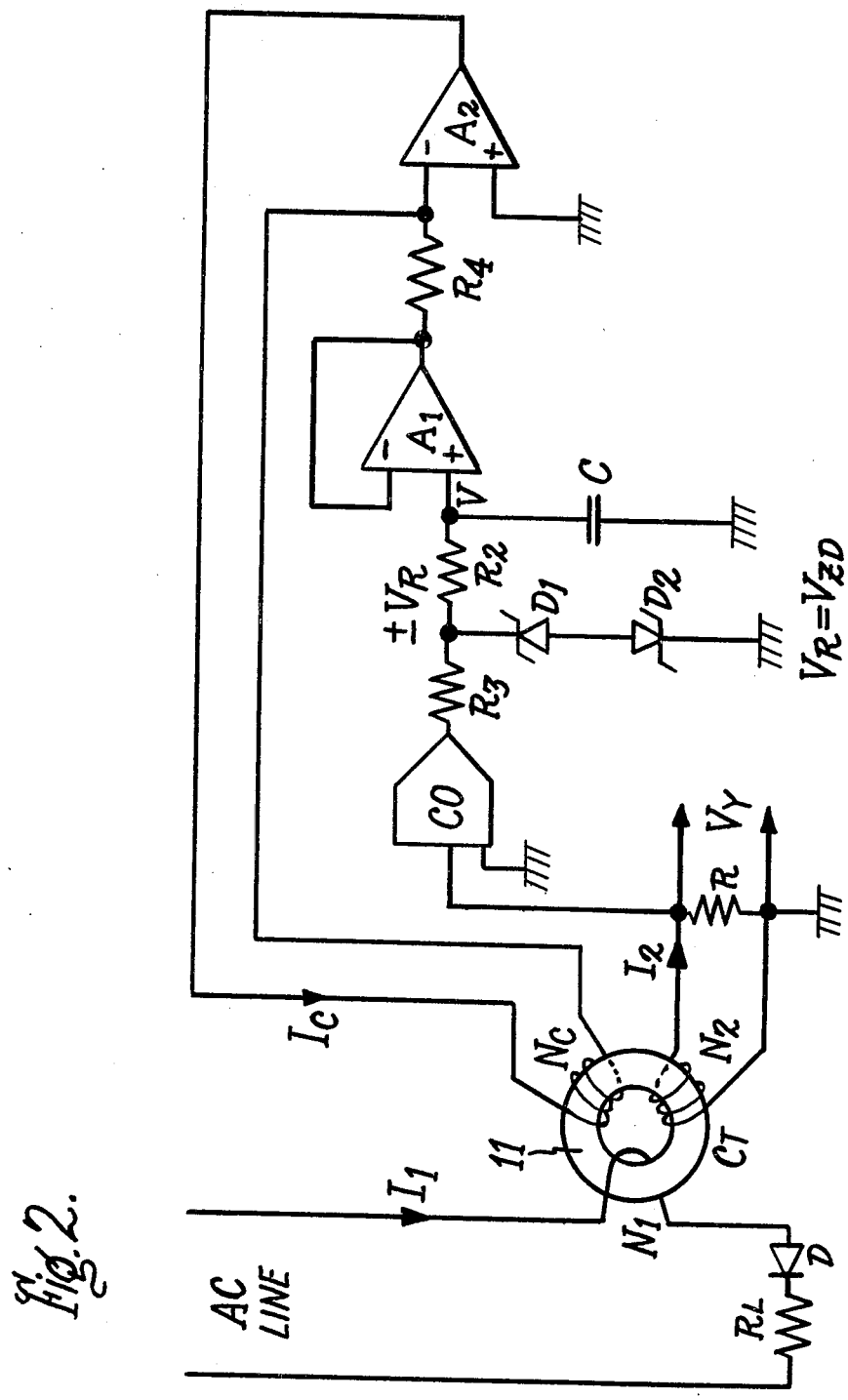
FIG. 2 is a more detailed circuit diagram of the zero crossing detection and averaging circuit together with a voltage to current conversion circuit employed in the electronic compensation circuit arrangement shown in block diagram form in FIG. 1.

FIG. 2 of the drawings is a detailed electronic circuit diagram of a preferred form of constructing the processing circuitry shown in block diagram form in FIG. 1. The circuitry is comprised by a conventional, commercially available comparator circuit CO of the type described in the above-referenced text "Applications of Operational Amplifiers" by J. G. Graeme, and is sold commercially by such semiconductor integrated circuit manufacturers as National Semiconductors, Inc. The output of comparator CO which serves as the zero crossing detector is supplied across a pair of serially connected, inversely poled zener diodes $D_1$ and $D_2$ having matched zener characteristics and connected in series circuit relationshp with a resistor $R_3$ across the output of the comparator CO. The zener diodes $D_1$ and $D_2$ are inversely poled so that for a negative going voltage, diode $D_1$ will be forward biased and diode $D_2$ will be reversed biased. Consequently, essentially no voltage drop will appear across the forward biased diode $D_1$ but the full zener voltage will appear across the diode $D_2$. Upon the reverse condition occurring, no voltage will appear across the diode $D_2$ due to a positive going signal pulse at the output of zero crossing detector CO but a positive going voltage will appear across the reversed biased zener diode $D_1$. Since both diodes have matched zener characteristics, the resulting output from the circuit will be amplitude referenced to the zener characteristics of the diodes and will result in a constant amplitude, varying period, positive going or negative going square waveshape signal.

The signal derived across zener diodes $D_1$ and $D_2$ is supplied across an averaging circuit comprised by a serially connected resistor $R_2$ and averaging capacitor C connected in series circuit relationship across the serially connected, inversely poled, zener diodes $D_1$ and $D_2$. The average charge built up on the averaging capacitor C will be due to the time duration differences of the amplitude referenced signal appearing across the zener diodes $D_1$ and $D_2$. This averaged signal is then supplied through an operational amplifier $A_1$ having a load resistor $R_4$ connected to its output terminal and having the output terminal directly connected back to the inverse terminal of the operational amplifier. The average output voltage appearing across load resistor $R_4$ of operational amplifier $A_1$ is supplied to the direct input terminal of an operational amplifier $A_2$ which serves as the voltage to current conversion circuit means for converting the average output voltage value appearing across averaging capacitor C to the compensating current $I_C$.

As a result of the above-described construction, the current $I_C$ supplied back to the compensating winding $N_C$ will be proportional to the direct current component superimposed on the supply alternating current $I_1$ flowing through the input winding $N_1$. Consequently, the combined effect of $I_C \cdot N_C$ will be to desaturate the core 11 of current transformer T to an extent necessary to overcome the effect of the superimposed DC component and to return the core to its unsaturated condition whereby it will operate over the linear portion of its saturation characteristic. Since the compensating winding $N_C$ is located in the feedback loop of the operational amplifier $A_2$, the compensating current $I_C$ supplying compensating winding $N_C$ will be driven from a high impedance source.

While a preferred form of zero crossing detection and averaging circuitry has been disclosed, other known zero crossing detection circuits as well as averaging circuits could be used. However, because of the comparatively low cost and stable operation afforded by the arrangement shown wherein amplitude referencing and averaging is accomplished in a simple zener diode capacitor network, the circuit arrangement shown is preferred because of the simplicity of its design and availability and low cost of its components. While the use of a sensing resistor R has been disclosed, it would be possible to employ an active load to obtain the voltage $V_Y$ for processing by the zero crossing detecting and averaging circuitry. Such an active load-like sensor could be, for example, the type described in U.S. Pat. No. 3,815,015 to M. Milkovic, assigned to the General Electric Company.

The input transformer CT together with the automatic compensation circuitry comprised by the zero crossing detection and averaging circuit CO, RES and $\tau$ together with the voltage to current conversion circuit V/I and compensation winding NC, could be substituted in place of any current transformer used as an input current transformer for a watthour meter. For example, in the electronic watthour meter disclosed in U.S. Pat. No. 3,955,138 the input current transformer could be removed and the input current transformer CT together with its associated automatic compensation circuitry described above and the compensating winding $N_C$, could be substituted in its place by connecting the resistor R across the terminals 28 and 30 of the meter shown in FIG. 1 of U.S. Pat. No. 3,955,138. Similar substitutions could be made in the watthour meter installations described in U.S. Pat. Nos. 3,875,508; 4,066,959 or 4,066,960, for example. All of U.S. Pat. Nos. 3,955,138; 3,875,508; 4,066,959; 4,066,960 and 3,815,013 are by the same inventor and assigned to the same assignee as the present invention.

From the foregoing description it will be appreciated that this invention provides a new and improved method and low cost circuit for nulling out the effect of a DC component superimposed on a supply alternating current being measured by a watthour meter installation. The method and circuitry comprises sensing the combined value of the supply alternating current with the DC component superimposed thereon and deriving a sensed signal output representative of both the supply AC and superimposed DC component. This sensed signal is converted to a sensed voltage signal and the zero crossing points of the voltage signal are detected, amplitude referenced and then averaged. The average output signal is then reconverted to a current signal and fed back through a compensating winding on a current transformer in advance of the watt hour meter installation. The feedback current is of an amplitude and in a direction to null out the DC component superimposed on the supply AC being measured. This is achieved without requiring more than one current transformer and uses relatively simple, low cost and proven circuit components.

Having described a preferred embodiment of a new and improved zero crossing detection method and circuitry for sensing the value of a DC component superimposed on the supply AC being measured by a watthour meter installation, and for deriving and feeding back a feedback signal for nulling out the effect of the superimposed DC component, it is believed obvious that other modifications and variations of the invention are possible in the light of the above teachings. It is therefore to be understood that changes may be made in the particular embodiment of the invention described which are within the full intended scope of the invention as defined by the appended claims.

What is claimed is:

1. In a watthour meter installation of the type including an input transformer having an input winding for connection to an alternating current power supply line, an output winding connected to the watthour meter for measuring alternating current power being consumed and a core on which said input and output windings are wound and which is susceptible to magnetization saturation by a DC component superimposed on the alternating current power being measured; the improvement comprising compensation circuit means for compensating for the effect of the DC component on the power measurement achieved with the watthour meter, said compensation circuit means comprising:

(a) sensing means coupled to sense the current flowing through said input winding and for deriving a sensed output signal proportional to the sensed current and which includes the AC and DC components of the current flowing through said input winding;

(b) sensed signal processing circuit means coupled to said sensing means for deriving from said sensed output signal a feedback signal which is proportional to the DC component of the current flowing through said input winding, said sensed signal processing circuit means comprising;

(i) current to voltage signal conversion circuit means supplied with said sensed signal for converting the same to a voltage signal, (ii) zero crossing sensing circuit means supplied with the voltage signal for sensing the zero crossings of the voltage signal in either a positive going or negative going direction relative to a reference voltage level and for deriving aperiodic zero crossing signals indicative of the occurrence of the zero crossings;

(iii) amplitude referencing circuit means responsive to said aperiodic zero crossing output signals for deriving a series of essentially constant amplitude varying duration positive and negative going square waveshape signals representative of the distortion of the waveshape of the sensed signal due to the superimposed DC component, (iv) averaging circuit means responsive to said amplitude referenced varying period positive and negative going square wave signals for deriving an average output voltage signal representative of the superimposed DC component, and (v) voltage to current signal conversion circuit means responsive to the average output voltage signal for converting the same to a current feedback signal; and (c) compensating winding means wound on said transformer core and having said current feedback signal supplied thereto in a direction to automatically cancel out the effects of the DC component on the magnetization characteristics of said input transformer.

2. A watthour meter installation according to claim 1 wherein said sensing means comprises a sensing impedance connected across the output winding and said sensed signal processing circuit means is coupled across the sensing impedance.

3. A watthour meter installation according to claim 1 wherein the amplitude referencing circuit means comprises a pair of serially connected inversely poled zener diodes having matched zener characteristics and connected in series circuit relationshp with an output load resistor across the output of said zero crossing sensing circuit means.

4. A watthour meter installation according to claim 2 wherein the amplitude referencing circuit means comprises a pair of serially connected inversely poled zener diodes having matched zener characteristics and connected in series circuit relationship with an output load resistor across the output of said zero crossing sensing circuit means.

5. A watthour meter installation according to claim 4 wherein said averaging circuit means comprises a serially connected resistor and averaging capacitor connected in series circuit relationship across said serially connected inversely poled zener diodes and an operational amplifier having a direct input terminal connected to the juncture of the series resistor and the averaging capacitor and a load resistor connected to its output.

6. A watthour meter installation according to claim 5 wherein said voltage to current signal conversion circuit means comprises a second operational amplifier having its inverse input terminal connected to the load resistor of the first operational amplifier, its direct input terminal connected to a source of reference potential and having the compensating winding means connected in a feedback path of said second operational amplifier intermediate the output and the inverse input terminal thereof.

7. The method of automatically compensating for the effect of a DC component superimposed on a supply alternating current being measured by a watthour meter installation comprising;

(a) sensing the supply alternating current having the DC component superimposed thereon and deriving a sensed signal output representative of both the supply AC and superimposed DC component current values, (b) converting the sensed signal to a sensed voltage signal, (c) sensing the zero crossings of the sensed voltage signal in either a positive going or negative going direction relative to a reference voltage level and deriving aperiodic zero crossing signals indicative of the zero crossings, (d) amplitude referencing the zero crossing signals to derive a series of substantially constant amplitude varying duration positive and negative going square waveshape signals representative of distortion in the waveshape of the sensed signal due to the superimposed DC component, (e) averaging the positive and negative square waveshape signals of varying duration to derive an average output voltage signal representative of the superimposed DC component, (f) converting the average output voltage signal to a current feedback signal, and (g) feeding back the current feedback signal ahead of the watthour meter installation in a direction to null out the effect of the DC component superimposed on the supply alternating current being measured.

* * * * *